United States Patent
Tomita et al.

(10) Patent No.: US 7,368,321 B2
(45) Date of Patent: May 6, 2008

(54) SEMICONDUCTOR PACKAGE AND METHOD FOR MANUFACTURING THE SAME

(75) Inventors: Michikazu Tomita, Tokyo (JP); Tatsuo Suemasu, Tokyo (JP); Sayaka Hirafune, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/828,699

(22) Filed: Jul. 26, 2007

(65) Prior Publication Data

US 2007/0264753 A1 Nov. 15, 2007

Related U.S. Application Data

(62) Division of application No. 11/166,195, filed on Jun. 27, 2005, now Pat. No. 7,274,101.

(30) Foreign Application Priority Data

Jun. 30, 2004 (JP) ............................. 2004-194663

(51) Int. Cl.
*H01L 21/00* (2006.01)
(52) U.S. Cl. ............... 438/113; 438/460; 257/E21.599; 257/E21.641
(58) Field of Classification Search ................ 438/110, 438/113, 460
See application file for complete search history.

(56) References Cited

U.S. PATENT DOCUMENTS

| | | |
|---|---|---|
| 5,220,198 A | 6/1993 | Tsuji |
| 5,739,585 A | 4/1998 | Akram et al. |
| 6,013,948 A | 1/2000 | Akram et al. |
| 6,191,370 B1 | 2/2001 | Oh |
| 6,229,404 B1 | 5/2001 | Hatanaka |
| 6,674,159 B1 | 1/2004 | Peterson et al. |

FOREIGN PATENT DOCUMENTS

| | | |
|---|---|---|
| EP | 1 251 566 | 10/2002 |
| EP | 1 376 705 | 1/2004 |
| EP | 1 577 942 | 9/2005 |
| JP | 9-205174 A | 8/1997 |
| JP | 2001-351997 A | 12/2001 |

*Primary Examiner*—David A Zarneke
(74) *Attorney, Agent, or Firm*—Sughrue Mion, PLLC

(57) ABSTRACT

A semiconductor package includes: a first substrate including: a semiconductor base material having a first side and a second side; a functional element that is provided at the first side of the semiconductor base material; a first wiring; a pad that is electrically connected to the functional element via the first wiring; a through-hole interconnection that is electrically connected to the pad and is provided in a hole that is defined penetrating the semiconductor base material from the first side thereof to the second side thereof, the through-hole interconnection including a first insulating film and a first conductive material formed on the first insulating film; and a sealing material provided surrounding the functional element; a second substrate that is bonded to a first side of the first substrate via the sealing material.

2 Claims, 4 Drawing Sheets

SEMICONDUCTOR PACKAGE AND METHOD FOR MANUFACTURING THE SAME

CROSS-REFERENCE TO RELATED APPLICATIONS

This Application is based upon and claims the benefit of priority from Japanese Patent Application No. 2004-194663, filed Jun. 30, 2004 in the Japanese Patent Office, the disclosure of which is incorporated herein in its entirety by reference.

BACKGROUND OF THE INVENTION

1. Field of the Invention

The invention relates to a packaging structure for a semiconductor package having a functional element and a through-hole interconnection that connects the front side and the back side, and to a method for manufacturing thereof.

2. Description of Related Art

In a related art technique for packaging a functional element such as a semiconductor light receiving sensor, a functional element is typically contained in a sealing container made of a ceramic or a resin and is then sealed. An example of this related art technique is shown in FIG. 5 (see Japanese Unexamined Patent Application, First Publication No. 2001-351997, for example).

A semiconductor package 40 shown in FIG. 5 includes a semiconductor substrate 41, through-hole interconnections 45b, a sealing material 47, and an optically transparent protecting member 46. A light receiving element 44a including microlenses 44b is provided on the semiconductor substrate 41 for enhancing light-gathering efficiency, and is electrically connected to the outside of the semiconductor package 40 via the wiring 44c and the through-hole interconnection 45b.

The optically transparent protecting member 46, such as a glass plate, is bonded using adhesive above the semiconductor substrate 41 via the sealing material 47 while keeping a certain distance with the light receiving sensor 44a and the microlenses 44b so that the protecting member 46 does not come in contact with the light receiving sensor 44a and the microlenses 44b. The sealing material 47 is cured after being applied so that the sealing material 47 continuously surrounds the light receiving sensor 44a while not covering the light receiving sensor 44a, and that the protecting member 46 does not come in contact with the light receiving sensor 44a and the microlenses 44b. This sealing material 47 secures the optically transparent protecting member 46 to semiconductor substrate 41 in order to mechanically protect the light receiving sensor 44a and the microlenses 44b as described above. At the same time, it functions as a shield for protecting the light receiving sensor 44a and the microlenses 44b from the surrounding environment.

Procedures to manufacture such a semiconductor package will be described below.

First, the light receiving sensor 44a, a driving circuit (not shown) for the light receiving sensor 44a, a circuit (not shown) for processing output, a wiring circuit 44c, or the like, are fabricated on the semiconductor substrate 41 using typical semiconductor manufacturing techniques.

Next, non-penetrating trenches are defined in portions of the semiconductor substrate 41 corresponding to the wiring circuit using anisotropic etching or the like, and an insulating layer (not shown) and the through-hole interconnections 45b that are made of a conductive layer connecting to the wiring circuit portion 44c are deposited inside the trenches.

Then, the sealing material 47 is disposed on one surface of the semiconductor substrate using a suitable method, such as screen printing or dispensing method or the like, so that the sealing material 47 continuously surrounds the light receiving sensor 44a while not covering the light receiving sensor 44a.

Next, the optically transparent protecting member 46 that has almost the same two-dimensional size as that of the semiconductor substrate is bonded to the sealing material 47, and the sealing material 47 is cured by the application of heat or ultraviolet light or the like.

Then, the back side of the semiconductor substrate 41 is etched until the through-hole interconnections 45b that have been formed previously are exposed.

Finally, numerous semiconductor packages 40 are obtained by dicing the semiconductor substrate 41 into a predetermined size.

On side surfaces of a thus obtained semiconductor package, the sealing material 47 that bonds the semiconductor substrate 41 and the optically transparent protecting member 46 together is exposed. A synthetic resin is typically used for the sealing material 47, and some synthetic resins do not necessarily exhibit sufficient sealing property, moisture resistance, chemical resistance, or other properties. Consequently, a semiconductor element that stably operates and has an extended life is difficult to obtain.

SUMMARY OF THE INVENTION

An object of the invention is to provide a semiconductor package that exhibits excellent sealing property, moisture resistance, or chemical resistance in order to ensure a stable operation and an extended life of an element.

Another object of the invention is to provide a method for manufacturing such a semiconductor package having a good sealing property, moisture resistance, or chemical resistance without major increase in additional steps.

In order to solve the problems described above, a semiconductor package according to the present invention is a semiconductor package including: a first substrate including: a semiconductor base material having a first side and a second side; a functional element that is provided at the first side of the semiconductor base material; a first wiring; a pad that is electrically connected to the functional element via the first wiring; a through-hole interconnection that is electrically connected to the pad and is provided in a hole that is defined penetrating the semiconductor base material from the first side thereof to the second side thereof, the through-hole interconnection including a first insulating film and a first conductive material formed on the first insulating film; and a sealing material provided surrounding the functional element; a second substrate that is bonded to a first side of the first substrate via the sealing material, wherein the first insulating film includes a second insulating film that is provided to the second side of the semiconductor base material, a third insulating film that is provided to an outer side surface of the semiconductor base material, and a fourth insulating film that is provided to an outer side surface of the sealing material.

Since the semiconductor package having such a structure is covered by an insulating material having an excellent shielding property without the sealing material being exposed on the side surfaces of the package, the semiconductor package exhibits enhanced sealing property, moisture resistance, chemical resistance, or the like. Furthermore, according to the semiconductor package of the present invention, the first insulating film, the second insulating film, the third insulating film, and the fourth insulating film may be formed as a single film.

Furthermore, the outer side surface of the insulating film of the package may be further coated with a conductive material.

Further, forming the insulating films as a single film is advantageous since the insulating property thereof can be enhanced. Furthermore, by coating the side surfaces with the conductive material, sealing property, moisture resistance, chemical resistance, or the like, can be further enhanced.

One method for manufacturing a semiconductor package includes: bonding a first substrate including a functional element, a first wiring, and a pad over a first side of a semiconductor base material, and a second substrate using a sealing material together so that the functional element is positioned therebetween; forming a mask having a predetermined pattern on a second side of the semiconductor base material; etching the semiconductor base material via the mask at a position corresponding to the pad to define a hole that reaches the pad, and to define a groove that reaches the sealing material surrounding the functional element, the first wiring, and the pad; etching the sealing material at the bottom of the groove to expose the second substrate; forming an insulating film on an inside of the hole and the groove; removing the insulating film that is provided at the bottom of the hole by etching; filling a first conductive material in the hole to form a through-hole interconnection; and cutting a the first substrate and the second substrate along an inner wall of the through-hole.

With such a manufacturing method, since the insulating material layer can be formed in the through-hole interconnection formation steps, an increase in the number of process steps can be minimized. Furthermore, the manufacturing method can provide a semiconductor package having an excellent sealing property, moisture resistance, or chemical resistance. Another method for manufacturing a semiconductor package includes: bonding a first substrate including a functional element, a first wiring, and a pad over a first side of a semiconductor base material, and a second substrate using a sealing material together so that the functional element is positioned therebetween; forming a mask having a predetermined pattern on a second side of the semiconductor base material; etching the semiconductor base material via the mask at a position corresponding to the pad to define a hole that reaches the pad, and to define a groove that reaches the sealing material surrounding the functional element, the first wiring, and the pad; etching the sealing material at the bottom of the groove to expose the second substrate; forming an insulating film on an inside of the hole and the groove; removing the insulating film that is provided at the bottom of the hole by etching; filling a first conductive material in the hole to form a through-hole interconnection and filling the first conductive material in the groove; and cutting the first substrate, the second substrate, and the first conductive material formed in the groove.

With these manufacturing methods, since the insulating material layer and the conductive material layer can be formed in the through-hole interconnection formation steps, an increase in the number of process steps can be minimized. Furthermore, the manufacturing method can provide a semiconductor package having an excellent sealing property, moisture resistance, or chemical resistance.

According to the semiconductor package of the invention, when the side surfaces of the semiconductor package are covered by an insulating film and/or a conductive material, a semiconductor package having an excellent sealing property, moisture resistance, or chemical resistance can be obtained irrespective of the sealing material used. Thus, packaged elements can operate stably and the life thereof is extended.

Furthermore, the method for manufacturing a semiconductor package of the invention is quite useful in that since the insulating material layer and the conductive material can be formed in the through-hole interconnection formation steps, an increase in the number of process steps can be minimized. Furthermore, the manufacturing method can provide a semiconductor package having excellent properties.

BRIEF DESCRIPTION OF THE DRAWINGS

The above and other objects, features and advantages of the invention will become more apparent by describing in detail exemplary embodiments thereof with reference to the attached drawings in which.

DETAILED DESCRIPTION OF EXEMPLARY EMBODIMENTS OF THE INVENTION

Exemplary embodiments of the invention will now be described below by reference to the attached Figures. The described exemplary embodiments are intended to assist the understanding of the invention, and are not intended to limit the scope of the invention in any way.

First Embodiment

Figure 1:
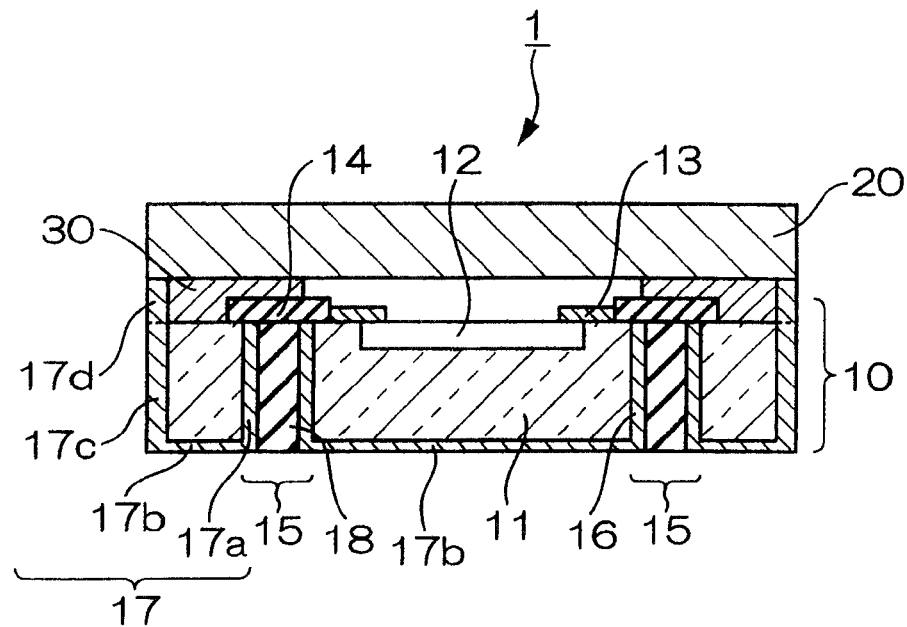
FIG. 1 is a cross-sectional view of a first embodiment of a semiconductor package according to the first aspect of the invention.

FIG. 1 is a cross-sectional view of a first embodiment of a semiconductor package according to an exemplary embodiment of the invention. A semiconductor package 1 according to this embodiment includes a first substrate 10 on which a functional element 12 is formed and a second substrate 20 that is a cap substrate, and the first substrate 10 and the second substrate 20 are bonded by the sealing material 30.

The first substrate 10 includes a semiconductor substrate 11. The functional element 12, and first wirings 13 and pads 14 connected thereto are provided on one side of the semiconductor substrate 11, and through-hole interconnections 15 electrically connect the other side of the semiconductor substrate 11 and the pads 14. The through-hole interconnections 15 are formed by filling, via an insulating film A 17a, a first conductive material 18 inside microholes (holes) 16 that penetrate the semiconductor substrate 11.

In this embodiment, the insulating film A 17a is formed as a single film with an insulating film B 17b that is formed on the other side of the semiconductor substrate 11, an insulating film C 17c that is formed on the side surfaces of the semiconductor substrate 11, and an insulating film D 17d that is formed on the side surfaces of the sealing material 30 of the semiconductor package 1.

The insulating film 17 may not be formed as a single film. For example, the insulating film A 17a, the insulating film C 17c, and the insulating film D 17d may be formed as a nitride film formed by a plasma CVD, and the insulating film B 17b may be formed as an oxide film formed by thermal oxidation method.

Alternatively, when the insulating film 17 is formed as a nitride film or oxide film formed by a plasma CVD, a portion of the oxide film corresponding to the insulating film B 17b may be removed in a etching step in which the insulating film at the bottom of the microholes is removed by the RIE (reactive ion etching) by over-etching the film and the insulating film A 17a, the insulating film C 17c, and the insulating film D 17d are left. Then, the insulating film B 17b may be formed using a synthetic resin, such as polyamide resin or polyimide resin.

In other words, in the semiconductor package of the invention, the insulating film A 17a, the insulating film B 17b, the insulating film C 17c and the insulating film D 17d shown in FIG. 1, may be provided as a single film or as separate films.

Since, in the outer region of the semiconductor package 1 of the invention, the side surfaces and the bottom surface of the through-hole interconnections 15 are covered by the insulating film 17 (except the front surface of the second substrate 20 and the top of the through-hole interconnection 15), the semiconductor package has an excellent sealing property, moisture resistance, and/or chemical resistance. In addition, since the sealing material 30 is covered by the insulating film 17d, humidity in the air does not penetrate to the bonding area. Thus, the functional element can operate stably and the life thereof is significantly extended since the functional element is fully protected.

Second Embodiment

Figure 2:
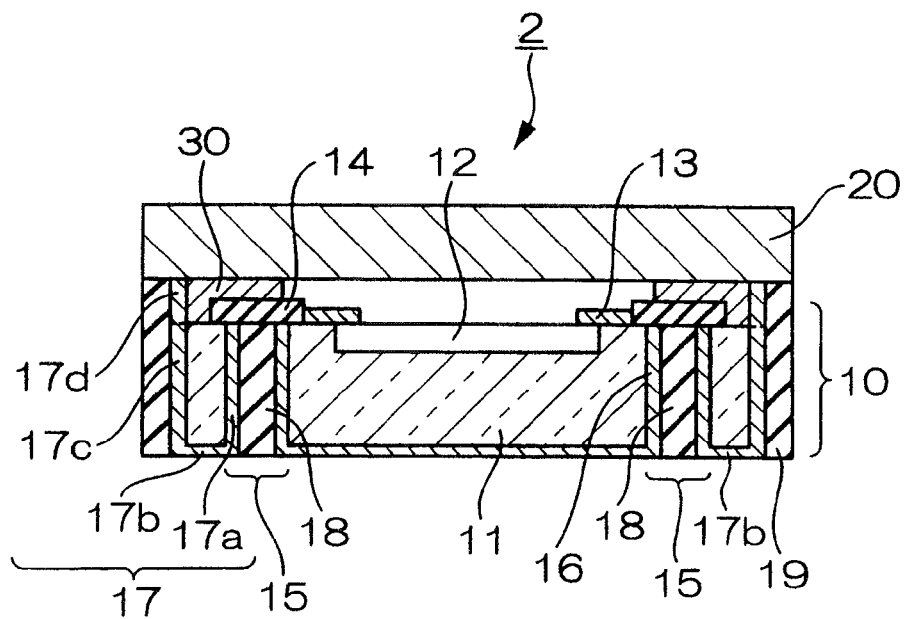
FIG. 2 is a cross-sectional view of a second embodiment of a semiconductor package according to the first aspect of the invention.

FIG. 2 is a cross-sectional view of a first embodiment of a semiconductor package 2 according to a second exemplary embodiment of the invention. The semiconductor package 2 according to this embodiment has a similar internal structure as that of the semiconductor package 1 of the first embodiment. In other words, the semiconductor package 2 includes a first substrate 10 on which a functional element 12 is formed and a second substrate 20 that is a cap substrate, and the first substrate 10 and the second substrate 20 are bonded by the sealing material 30. The first substrate 10 includes a semiconductor substrate 11. The functional element 12, and first wirings 13 and pads 14 connected thereto are provided on one side of the semiconductor substrate 11, and through-hole interconnections 15 electrically connect the other side of the semiconductor substrate 11 and the pads 14. The through-hole interconnections 15 are formed by filling a first conductive material 18 inside microholes 16 that penetrate the semiconductor substrate 11 via an insulating film A 17a. The insulating film A 17a is formed as a single film with an insulating film B 17b that is formed on the other side of the semiconductor substrate 11, an insulating film C 17c that is formed on the side surfaces of the semiconductor substrate 11, and an insulating film D 17d that is formed on the side surfaces of the sealing material 30 of the semiconductor package 1.

In the semiconductor package 2 according to the second embodiment, the surfaces of the insulating film C 17c that is formed on the side surfaces of the semiconductor substrate 11 and the insulating film D 17d that is formed on the side surfaces of the sealing material 30 are covered by a second conductive material 19. In this embodiment, since the side surfaces of the semiconductor package are coated with a two films: the insulating film and the conductive material, the sealing property is further enhanced. Thus, the functional element can operate stably and the life thereof is significantly extended since the functional element is fully protected.

Next, one example of a method for manufacturing these semiconductor packages will be described with reference to the drawings.

FIG. 3A to FIG. 4D are cross-sectional views showing steps in the method for manufacturing a semiconductor package according to the invention.

First, a first substrate 10 is provided by forming a desired functional element 12 such as an optical device, first wirings 13, and pads 14 for connection on semiconductor substrate 11, such as a silicon substrate, using a typical semiconductor manufacturing processes.

Materials having an excellent conductivity, for example, aluminum (Al), copper (Cu), aluminum-silicon (Al—Si) alloy, and aluminum-silicon-copper (Al—Si—Cu) alloy, may be used for the first wirings 13 and the pads 14. These materials, however, are easily oxidized.

Figure 3A:
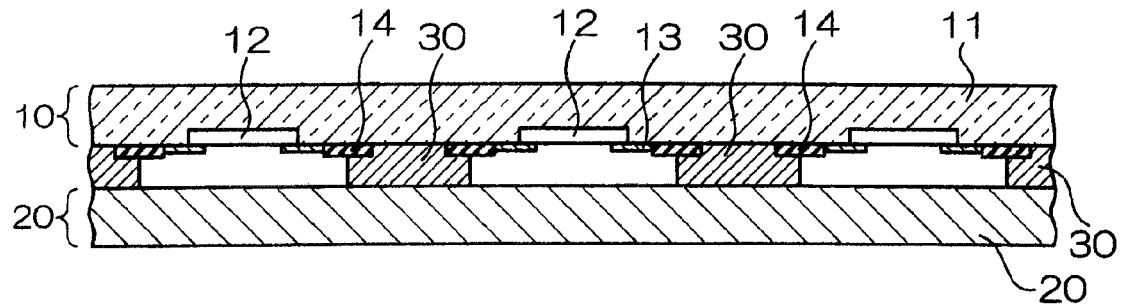
FIGS. 3A to 3D are cross-sectional views showing steps of a method for manufacturing a semiconductor package according to the invention.

Then, as shown in FIG. 3A, the first substrate 10 having the functional element 12 and the second substrate 20 that is to be a cap member are bonded together using the sealing material 30. Upon bonding, the functional element 12 is covered by the second substrate 20 so that the second substrate 20 does not come in contact with the functional element 12. As the second substrate 20, a semiconductor substrate, such as a silicon substrate, may be used. Examples of the sealing material 30 includes, for example, a photosensitive or non-photosensitive liquid-type resin (UV-curable resin, visible light curable resin, infrared light curable resin, thermal curable resin, or the like), or dry films. Examples of resins includes epoxy resins, silicone resins, acrylic resins, polyimide resins, or the like, and any suitable resin may be selected according to the environment in which the semiconductor package is to be used.

For forming the layer of the sealing material 30, for example, a liquid-type resin may be coated at predetermined positions using a printing method. Alternatively, a dry film may be applied and then patterned to leave the film at predetermined positions using the photolithography technique.

Figure 3B:
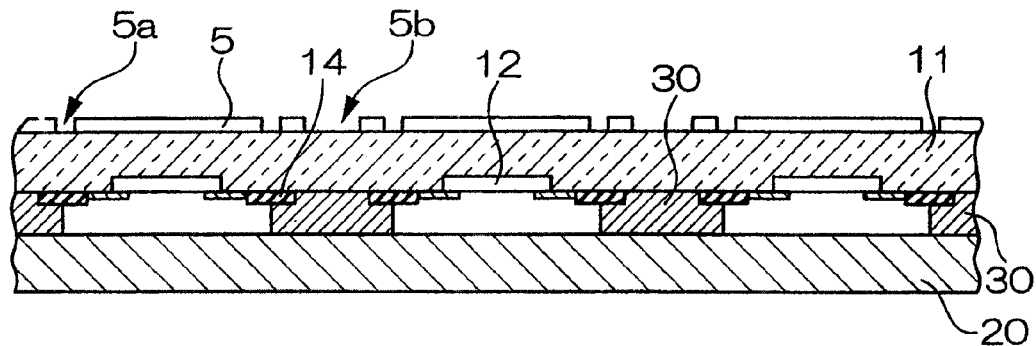

Next, as shown in FIG. 3B, masks 5 are formed on the other side of the semiconductor substrate 11. As the masks 5, for example, a UV-curable resin, or polyimide-based photosensitive resin, or the like, may be used, and openings 5a and 5b are defined at predetermined positions using the photolithography. The openings 5a are formed to define microholes 16 for forming wiring structure, and are formed as small circular holes, for example, at positions corresponding to the pads 14. In contrast, the openings 5b are formed to form a structure for protecting the functional element 12, and are formed so that they surround functional element 12, the first wirings 13, and the pads 14 with the functional element 12 being positioned at the center.

Figure 3C:
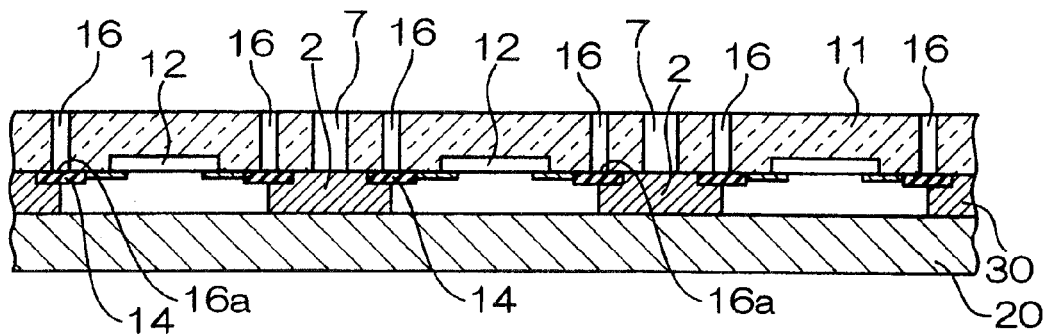

Next, as shown in FIG. 3C, portions of the semiconductor substrate 11 at the openings 5a and 5b are etched via the masks 5, for example, by the reactive ion etching (deep reactive ion etching: DRIE, for example) method or the like to define microholes 16 and grooves 7. The DRIE method enables formation of holes with high precision. In the DRIE method, the silicon substrate is deeply etched by alternately carrying out high-density plasma etching using sulfur hexafluoride ($SF_6$) as an etching gas and deposition of a passivation film on side walls (Bosch process). Although it is not shown in the drawing, however, grooves 7 are defined so that they surround the functional element 12. Thereafter, the masks 5 are removed where necessary.

The shape of microholes 16 is not particularly limited, and may be of any shape, provided that sufficient contact area with the pad 14 is ensured, and they may be shaped as ovals, rectangles, triangles, or squares.

Furthermore, the method for forming the microholes 16 is not limited to the DRIE method, and other methods, such as a wet etching method using a potassium hydroxide (KOH) aqueous solution may be used.

Figure 3D:
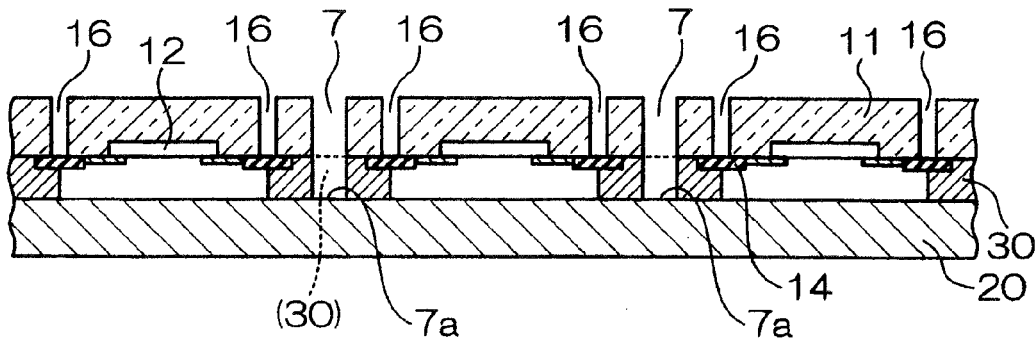

Next, as shown in FIG. 3D, the sealing material 30 at the bottoms 7a of the grooves 7 is removed using any suitable technique, such as dry etching.

It should be noted that this step can be omitted by providing a scribe line to the sealing material 30.

Figure 4A:
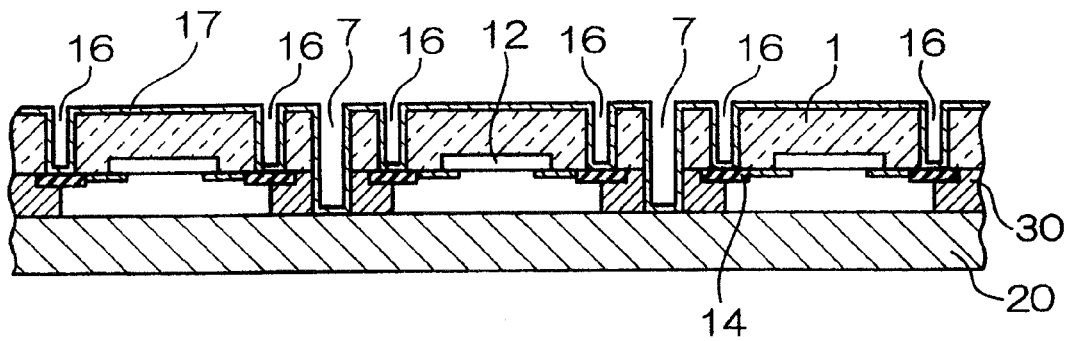
FIGS. 4A to 4D are cross-sectional views showing steps after the steps in FIGS. 3A to 3D.

Next, as shown in FIG. 4A, the insulating film 17 is formed on the entire surface of the substrate of FIG. 3D. Silicon oxide ($SiO_2$), silicon nitride ($Si_3N_4$), phosphorus silicate glass (PSG), boron phosphorus silicate glass (BPSG), or the like, may be used for the insulating film 17, and the material may be selected according to the environment in which the semiconductor package is to be used. Films made of $SiO_2$ and $Si_3N_4$ can be deposited to a desired thickness using a CVD method. An insulating film made of $SiO_2$ can be deposited by the plasma CVD method, for example, using silane or tetraethoxy silane (TEOS).

With this method, the insulating film A 17a, the insulating film B 17b, the insulating film C 17c, and the insulating film D 17d shown in FIG. 1 and FIG. 2 are formed as a single film.

Figure 4B:
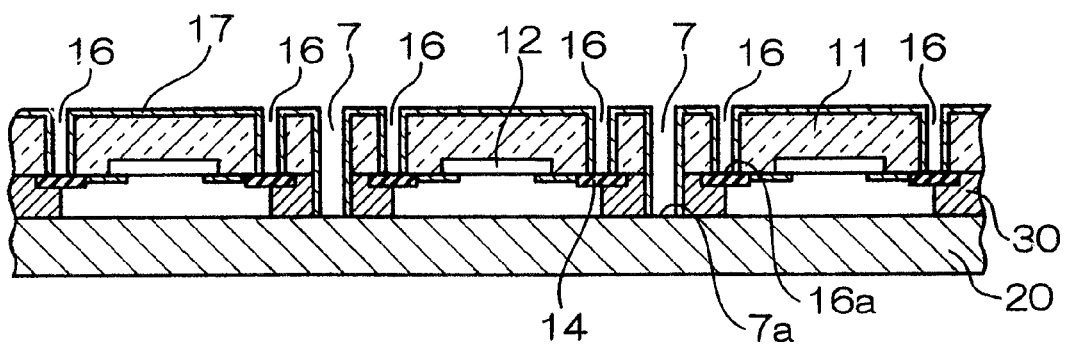

Next, as shown in FIG. 4B, the insulating film 17 at the bottoms of the microholes 16 and the groove 7 are removed using a dry etching so that the surfaces 16a of the pads 14 and the surfaces 7a of the second substrate 20 are exposed. It should be noted that removal of the insulating film 17 by etching at the bottoms of the grooves 7 may be optional.

For etching $SiO_2$, a reactive ion etching (RIE) technique with carbon tetrafluoride (CF4) may be used.

Figure 4C:
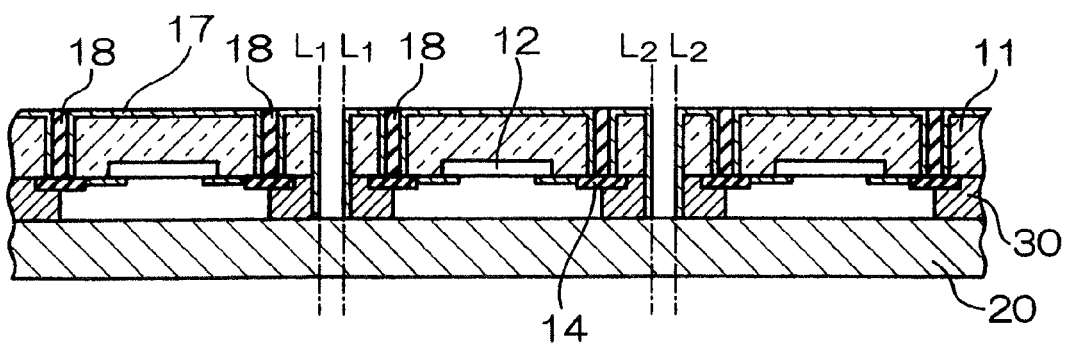
Figure 4D:
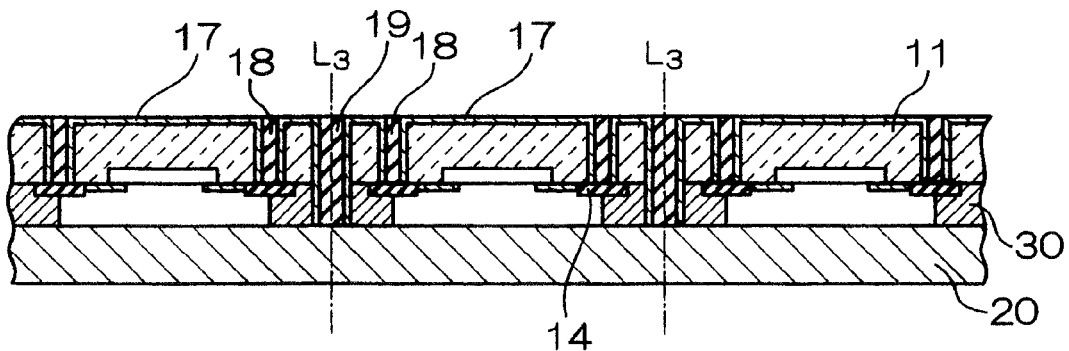
Figure 5:
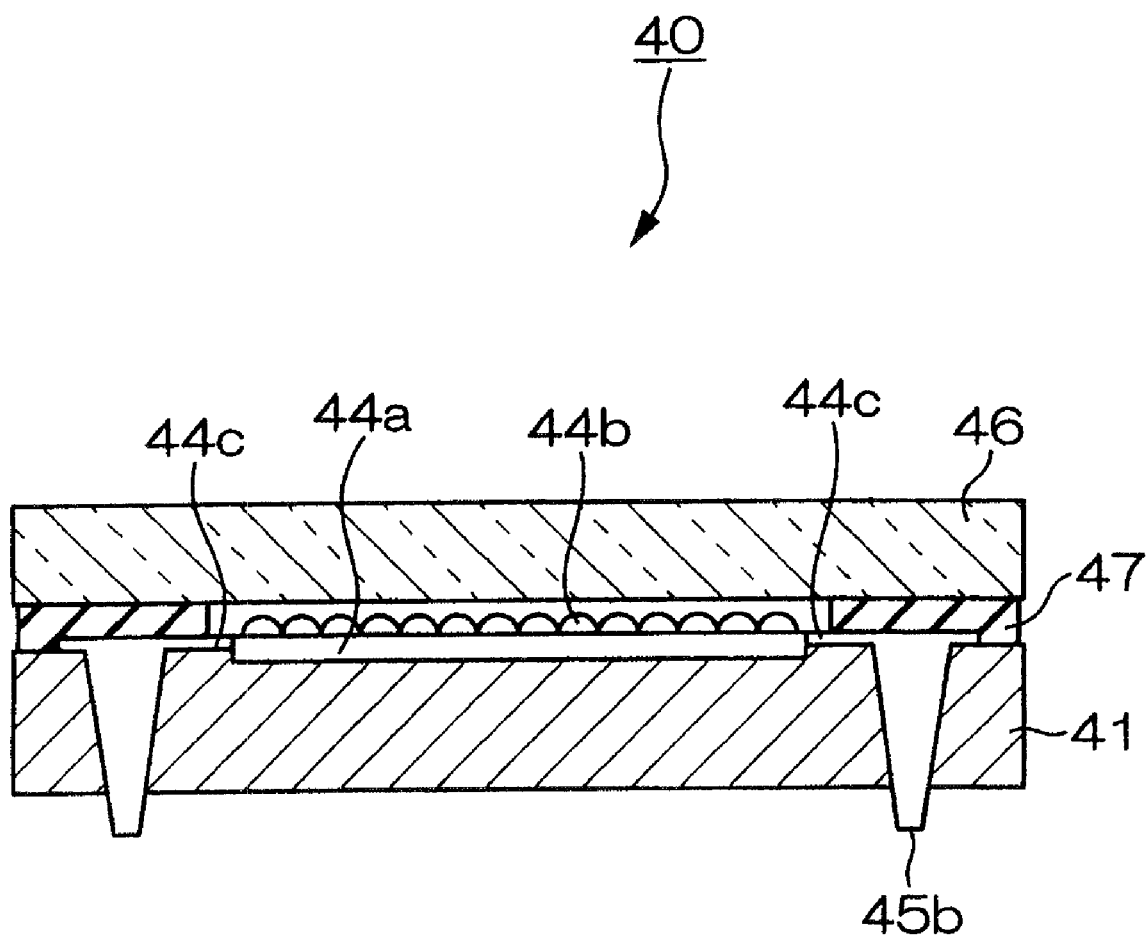
FIG. 5 is a cross-sectional view showing a conventional semiconductor package.

Next, as shown in FIG. 4C, a first conductive material 18 is disposed inside the microholes 16 using the molten metal suction method or the like. The conductive material 18 may be disposed only the inside of the microholes 16 as shown in FIG. 4C. Alternatively, it may be possible to dispose the second conductive material 19 in the grooves 7 in addition to the microholes 16, as shown in FIG. 4D.

As the conductive material, any electrically conductive material may be used, for example, a metal having a low electrical resistance, such as copper, aluminum, nickel, chromium, silver, tin, or the like; alloys, such as Au—Sn, Sn—Pb; or solder alloys such as Sn-based, Pb-based, Au-based, In-based, and Ag-based alloys, may be used. By a proper selection of metal that is suitable for the environment in which the semiconductor package is be used, a semiconductor package having an excellent shielding property can be fabricated.

Then, the semiconductor package 1 of the first embodiment shown in FIG. 1 is obtained by cutting the substrate along lines L1 and L2 shown in FIG. 4C at the inner wall of the groove 7.

Since in the outer region of the semiconductor package 1, the side surfaces and the bottom surface of the through-hole interconnections 15 are covered by the insulating film 17 except the front surface of the second substrate 20 and the top of the through-hole interconnection 15, the semiconductor package has an excellent sealing property, moisture resistance, and/or chemical resistance. In addition, since the sealing material 30 is covered by the insulating film 17d, humidity in the air does not penetrate to the bonding area. Thus, the functional element can operate stably and the life thereof is significantly extended since the functional element is fully protected.

Optionally, as shown in FIG. 4D, the second conductive material 19 may be disposed in the grooves 7 as well as in the microholes. Then, the substrate is cut along the lines L3 that run through the center of the second conductive material 19 in the grooves 7. Thus, the semiconductor package 2 of the second embodiment shown in FIG. 2 is obtained. The same metal may be used for both the first conductive material 18 and the second conductive material since the first conductive material 18 and the second conductive material can be provided simultaneously in a single step.

In the semiconductor package 2, the surface of the insulating film C 17c that is formed on the side surfaces of the above-described semiconductor substrate 11 and the surfaces of the insulating film D 17d that is formed on side surfaces of the sealing material 30 are covered by a second conductive material 19.

In this embodiment, since the side surfaces of the semiconductor package are coated with two layers of films, that is, the insulating film and the conductive film made of metal, the sealing property is further enhanced. Thus, the functional element can operate stably and the life thereof is significantly extended since the functional element is fully protected.

The invention is quite useful in that it can enable manufacturing of a semiconductor package having a high-performance and extended life.

While exemplary embodiments of the invention have been described and illustrated above, it should be understood that these are examples of the invention and are not to be considered as limiting. It will be understood by those of ordinary skill in the art that various additions, omissions, substitutions, and other modifications can be made without departing from the spirit or scope of the invention as defined by the appended claims.

What is claimed is:

1. A method for manufacturing a semiconductor package, comprising:
   bonding a first substrate comprising a functional element, a first wiring, and a pad over a first side of a semiconductor base material, and a second substrate using a sealing material together so that the functional element is positioned therebetween;
   forming a mask having a predetermined pattern on a second side of the semiconductor base material;
   etching the semiconductor base material via the mask at a position corresponding to the pad to define a hole that reaches the pad, and to define a groove that reaches the sealing material surrounding the functional element, the first wiring, and the pad;
   etching the sealing material at the bottom of the groove to expose the second substrate;
   forming an insulating film on an inside of the hole and the groove;
   removing the insulating film that is provided at the bottom of the hole by etching;
   filling a first conductive material in the hole to form a through-hole interconnection; and
   cutting a the first substrate and the second substrate along an inner wall of the through-hole.

2. A method for manufacturing a semiconductor package, comprising:

bonding a first substrate comprising a functional element, a first wiring, and a pad over a first side of a semiconductor base material, and a second substrate using a sealing material together so that the functional element is positioned therebetween;

forming a mask having a predetermined pattern on a second side of the semiconductor base material;

etching the semiconductor base material via the mask at a position corresponding to the pad to define a hole that reaches the pad, and to define a groove that reaches the sealing material surrounding the functional element, the first wiring, and the pad;

etching the sealing material at the bottom of the groove to expose the second substrate;

forming an insulating film on an inside of the hole and the groove;

removing the insulating film that is provided at the bottom of the hole by etching;

filling a first conductive material in the hole to form a through-hole interconnection and filling the first conductive material in the groove; and cutting the first substrate, the second substrate, and the first conductive material formed in the groove.

\* \* \* \* \*

UNITED STATES PATENT AND TRADEMARK OFFICE
CERTIFICATE OF CORRECTION

| | |
|---|---|
| PATENT NO. | : 7,368,321 B2 |
| APPLICATION NO. | : 11/828699 |
| DATED | : May 6, 2008 |
| INVENTOR(S) | : Michikazu Tomita |

Page 1 of 1

It is certified that error appears in the above-identified patent and that said Letters Patent is hereby corrected as shown below:

Column 8, Line 67 Delete - "through-hole" and insert --groove--

Signed and Sealed this

Ninth Day of June, 2009

JOHN DOLL
*Acting Director of the United States Patent and Trademark Office*